United States Patent
Wu

(10) Patent No.: US 8,154,125 B2
(45) Date of Patent: Apr. 10, 2012

(54) CHIP PACKAGE STRUCTURE

(75) Inventor: Jeng-Da Wu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 332 days.

(21) Appl. No.: 12/138,444

(22) Filed: Jun. 13, 2008

(65) Prior Publication Data

US 2008/0247149 A1    Oct. 9, 2008

Related U.S. Application Data

(62) Division of application No. 10/908,075, filed on Apr. 27, 2005, now Pat. No. 7,407,833.

(30) Foreign Application Priority Data

Apr. 27, 2004   (TW) ................................ 93111708 A

(51) Int. Cl.
*H01L 23/48*    (2006.01)

(52) U.S. Cl. ........................................ 257/738; 257/737
(58) Field of Classification Search ................... 257/738
See application file for complete search history.

(56) References Cited

U.S. PATENT DOCUMENTS

| | | | | |
|---|---|---|---|---|
| 2003/0234447 | A1* | 12/2003 | Yunus et al. .................. | 257/739 |
| 2004/0209399 | A1* | 10/2004 | Sunohara et al. ............. | 438/108 |
| 2005/0258548 | A1* | 11/2005 | Ogawa et al. ................. | 257/778 |

* cited by examiner

Primary Examiner — Samuel Gebremariam
(74) Attorney, Agent, or Firm — Jianq Chyun IP Office

(57) ABSTRACT

A chip package structure including a carrier, a chip, and an underfill layer is disclosed. The carrier has a number of bumps disposed thereon. The chip has an active surface. The chip is flip-chip bonded and electrically connected to the carrier through the bumps such that the active surface of the chip faces the carrier. The underfill layer is disposed on the carrier between the chip and the carrier such that a gap is maintained between the underfill layer and the chip.

19 Claims, 4 Drawing Sheets

CHIP PACKAGE STRUCTURE

CROSS-REFERENCE TO RELATED APPLICATION

This application is a divisional of an application Ser. No. 10/908,075, filed on Apr. 27, 2005, now allowed claims the priority benefit of Taiwan application serial no. 93111708, filed on Apr. 27, 2004. The entirety of the above-mentioned patent applications is hereby incorporated by reference herein and made a part of this specification.

BACKGROUND OF THE INVENTION

1. Field of the Invention

The present invention relates to a chip package structure and process of fabricating the same. More particularly, the present invention relates to a chip package structure and process of fabricating the same that deploys a flip chip bonding technique.

2. Description of the Related Art

In this information world, the market for electronic devices is expanding at a rapid pace. To sustain this expansion, the chip packaging techniques need to reflects the trend for more digital circuits, network capabilities, local connectivity and customization. These demands in turn reflect the need to increase the processing speed of the electronic devices, miniaturize and increase the level of integration of these devices, incorporate more functions into each package and lower the production cost of each package. As a result, more miniaturized and high-density chip packages are produced. In the flip-chip technique, bumps instead of wires are used to connect a chip and a carrier together so that the average wiring length in a flip chip package is reduced. Since the transmission speed of signals between the chip and the carrier is significantly improved, flip chip packages have gradually become mainstream high-density packages.

FIG. 1 is a schematic cross-sectional view of a chip package structure fabricated using a conventional flip-chip bonding technique. As shown in FIG. 1, the chip package structure 40 mainly comprises a chip 50, a carrier 80 and a plurality of bumps 60. The chip 50 in the chip package structure 40 has an active surface 52 and the active surface 52 has a plurality of bonding pads 54 disposed thereon. The carrier 80 has a plurality of contacts 84 disposed thereon. The bumps 60 are disposed on the bonding pads 54 on the active surface 52 of the chip 50. The chip 50 is electrically connected to the carrier 80 through the bonding pads 54, the bumps 60 and the contacts 84.

To prevent possible damage to the chip 50 due to moisture incursion or possible damage to the bumps 60 which connect the chip 50 and the carrier 80 together due to mechanical stress, an underfill layer 70 is also formed between the chip 50 and the carrier 80. However, the chip 50, the bumps 60, the underfill layer 70 and the carrier 80 all have different coefficient of thermal expansion (CTE). Through cyclic temperature changes in processing operations, the chip package structure 40 may ultimately fail as a result of cumulative thermal stress.

In general, the upper layer of most chips is a metallic interconnect structure comprising a plurality of conductive layers and dielectric layers alternately laid over each other. When the Young's modulus E of the underfill layer is high, thermal stress will force a delamination between the conductive layer and the dielectric layer from each other leading to a damage to the metallic interconnect structure. With the application of copper processing technique in semiconductor chip production, the conventional materials constituting the conductive layer and dielectric layer have already changed from aluminum and silicon dioxide to copper and organic compound. Since the adhesive strength between copper and the low dielectric constant (low k) dielectric layer is worse than the adhesive strength between aluminum and silicon dioxide, the delamination between a copper conductive layer and a low dielectric constant dielectric layer under thermal stress will occur more frequently.

In brief, minimizing possible damage to the metallic interconnect structure inside a chip resulting from differences in coefficient of thermal expansion between various components inside a package, including the chip, the bumps, the underfill layer and the carrier, is an important research topic.

SUMMARY OF THE INVENTION

Accordingly, at least one objective of the present invention is to provide a chip package structure and method of fabricating the same that can minimize the damages to the chip resulting the thermal expansion of an underfill layer inside the package.

To achieve these and other advantages and in accordance with the purpose of the invention, as embodied and broadly described herein, the invention provides a chip package structure. The chip package structure mainly comprises a carrier, a chip and an underfill layer. The carrier has a plurality of bumps disposed thereon. The chip has an active surface. The chip is flip-chip bonded and electrically connected to the carrier through the bumps with the active surface of the chip facing the carrier. The underfill layer is disposed on the carrier between the chip and the carrier such that a gap is maintained between the chip and the underfill layer.

In the present embodiment, the carrier is a package substrate, for example. The chip package structure further comprises an array of solder balls disposed on the surface of the carrier away from the chip.

The present invention also provides a chip packaging process. First, a carrier and a chip are provided. The carrier has a plurality of bumps disposed thereon and the chip has an active surface. Thereafter, an underfill layer is formed on the surface of the carrier having bumps disposed thereon. The underfill layer is disposed between the bumps but without covering them. Each of the bumps has approximately the same height. Furthermore, the height of each bump is greater than the thickness of the underfill layer. Finally, the chip is flip-chip bonded to the carrier so that the chip and the carrier are electrically connected through the bumps.

In the present embodiment, an array of solder balls may also be disposed on the surface of the carrier away from the chip before flip-chip bonding. Alternatively, after flip-chip bonding the chip to carrier, an array of solder balls is formed on the surface of the carrier away from the chip.

The present invention also provides an alternative chip packaging process. First, a carrier and a chip are provided. The carrier has a plurality of first bumps disposed thereon and the chip has an active surface. Thereafter, an underfill layer is formed on the surface of the carrier where the first bumps are laid such that the first bumps are exposed. A plurality of second bumps are formed on the first bumps such that each of the second bumps is formed on one of the first bumps respectively. Finally, the chip is flip-chip bonded to the carrier so that the chip and the carrier are electrically connected through the first bumps and the second bumps.

In the present embodiment, the method of exposing the first bumps in the underfill layer includes performing a grinding operation to remove a portion of the underfill layer and expose the first bumps. An array of solder balls may also be disposed on the surface of the carrier away from the chip before flip-chip bonding. Alternatively, after flip-chip bonding the chip to carrier, an array of solder balls is formed on the surface of the carrier away from the chip.

The method of forming the second bumps over the first bumps may comprise the following steps. First, a photoresist layer is formed over the carrier to cover the underfill layer and the first bumps. Thereafter, a plurality of openings are formed in the photoresist layer to expose the first bumps and then a solder material is deposited into the openings. After that, the photoresist layer is removed. Finally, a reflow process is carried out to melt and transform the solder material into the second bumps on top of each first bump. The photoresist layer can be a dry film and the method of depositing the solder material into the openings can be a stencil printing process.

In brief, the underfill layer inside the chip package structure of the present invention only covers the carrier side of the gap between the carrier and the chip. Since the chip is detached from the underfill layer, the underfill layer no longer produces any damaging effect on the chip as a result of thermal expansion. Moreover, processing time required for chip packaging is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
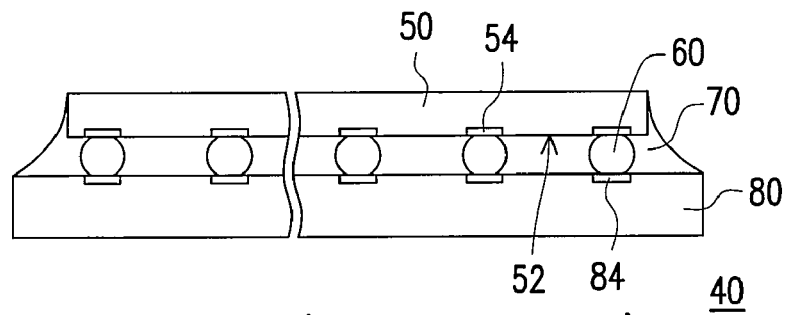
FIG. 1 is a schematic cross-sectional view of a chip package structure fabricated using a conventional flip-chip bonding technique.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
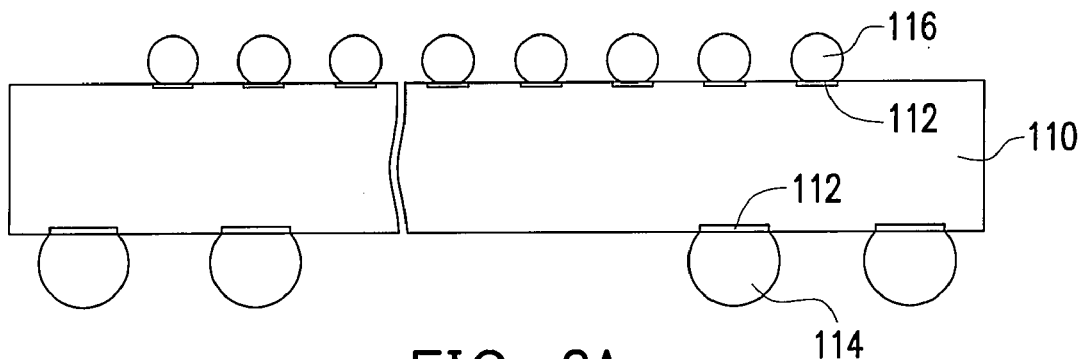
FIGS. 2A through 2C are schematic cross-sectional views showing the steps for fabricating a chip package according to a first embodiment of the present invention.
Figure 2B:
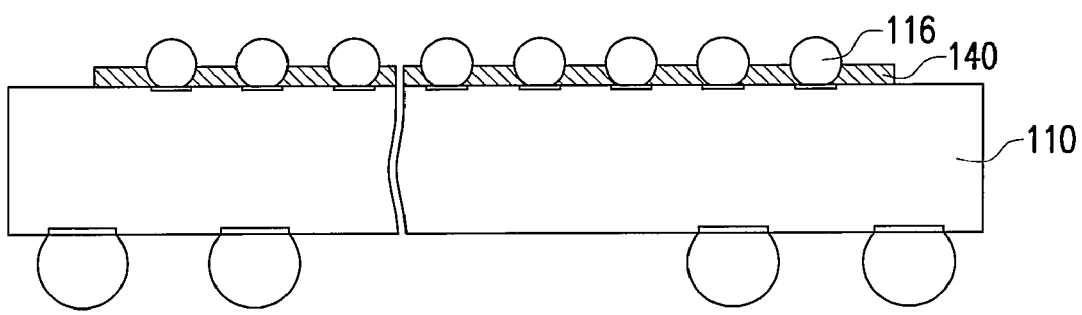
Figure 2C:
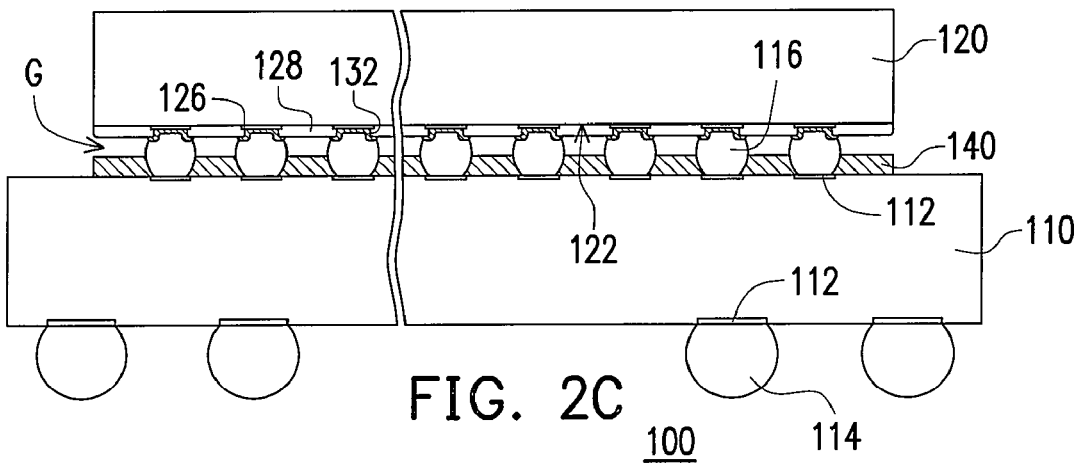

FIGS. 2A through 2C are schematic cross-sectional views showing the steps for fabricating a chip package according to a first embodiment of the present invention. As shown in FIG. 2A, a carrier 110 and a chip 120 are provided. The chip 120 is shown in FIG. 2C. The carrier 110 has a plurality of bumps 116 disposed thereon. The carrier 110 is a package substrate such as an organic substrate. The top and the bottom surface of the carrier 110 have a plurality of contacts 112. The bumps 116 are disposed on a portion of the contacts 112. An array of solder balls 114 are disposed on the contacts 112 on the surface of the carrier 110 away from the chip 120 so that the chip package can connect electrically with a printed circuit board (not shown) as a ball grid array (BGA) package.

The chip 120 has an active surface 122. The active surface 122 has a plurality of bonding pads 126 and a passivation layer 128. The passivation layer 128 serves to protect the chip 120 and has openings that expose the bonding pads 126. Furthermore, an under-bump metallic (UBM) layer 132 is formed over each bonding pad 126 after patterning a metallic layer.

As shown in FIG. 2B, an underfill layer 140 is formed on the surface of the carrier 110 where the bumps 116 are disposed. The underfill layer 140 is disposed between the bumps 116 but without enclosing the bumps 116. Each of the bumps 116 has approximately the same height. The height of each bump 116 is greater than the thickness of the underfill layer 140. In other words, the bumps 116 protrude beyond the top surface of the underfill layer 140.

As shown in FIG. 2C, the chip 120 is flip-chip bonded and electrically connected to the carrier 110 through the bumps 116 such that the bumps 116 and the under-bump metallic layer 132 on the chip 120 are aligned together.

It should be noted that solder balls 114 could be attached to the surface of the carrier 110 away from the chip 120 after the chip 120 is flip-chip bonded to the carrier 110.

The present invention also provides a chip package structure 100 according to the first embodiment. As shown in FIG. 2C, the chip package structure 100 mainly comprises a carrier 110, a chip 120 and an underfill layer 140. The carrier 110 has a plurality of bumps 116 thereon. The chip 120 has an active surface 122. The chip 120 is flip-chip bonded and electrically connected to the carrier 110 using the bumps 116 such that the active surface 122 of the chip 120 faces the carrier 110. The underfill layer 140 is formed on the carrier 110 between the chip 120 and the carrier 110. The underfill layer is detached from the chip such that a gap G is maintained between the underfill layer 140 and the chip 120. The chip package structure 100 may further comprise an array of solder balls 114 disposed on the surface of the carrier 110 away from the chip 120.

Figure 3A:
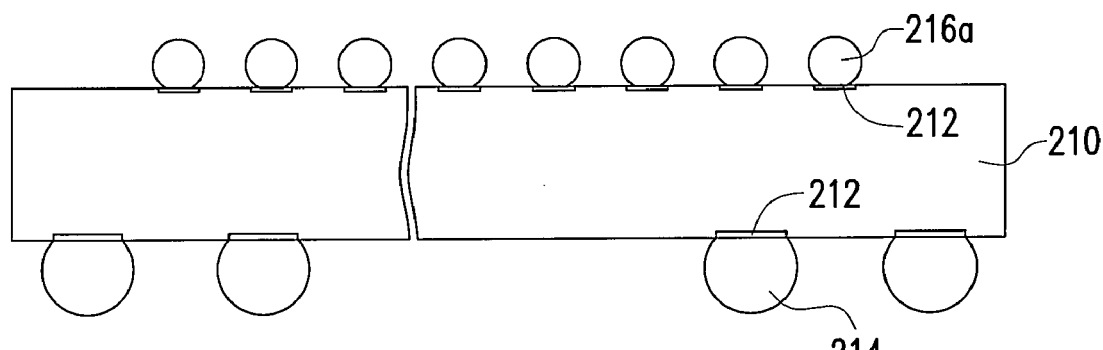
FIGS. 3A through 3E are schematic cross-sectional views showing the steps for fabricating a chip package according to a second embodiment of the present invention.

FIGS. 3A through 3E are schematic cross-sectional views showing the steps for fabricating a chip package according to a second embodiment of the present invention. As shown in FIG. 3A, a carrier 210 and a chip 220 are provided. Since the carrier 210 and the chip 220 are identical to the carrier 110 and the chip 120 in the first embodiment, detailed description is omitted.

Figure 3B:
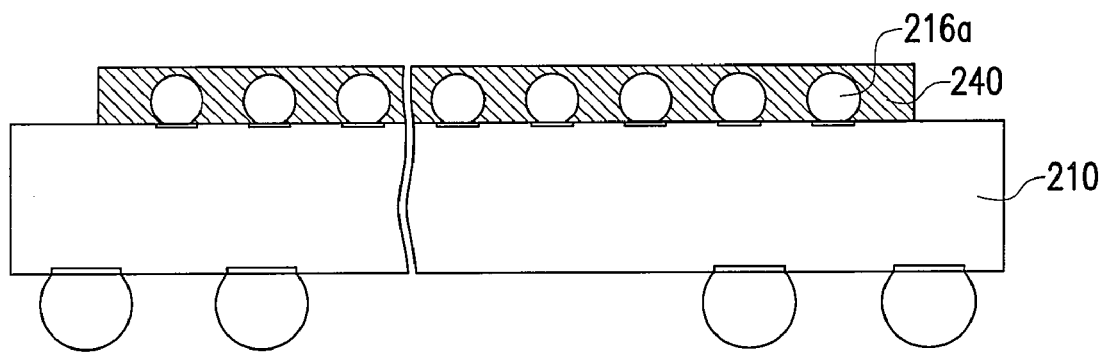

As shown in FIG. 3B, an underfill layer 240 is formed on the surface of the carrier 210 where first bumps 216a are disposed. The underfill layer 240 encloses the first bumps 216a, for example. The underfill layer 240 is formed, for example, by dispensing an underfill material over the carrier 210 and then curing the underfill material.

Figure 3C:
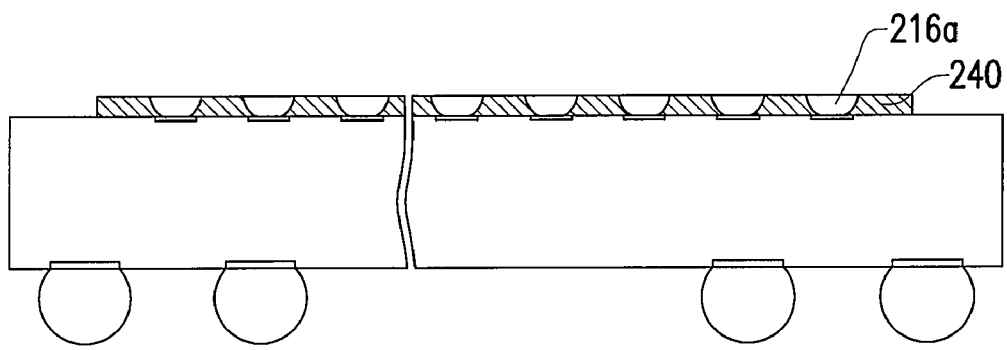

As shown in FIG. 3C, a portion of the underfill layer 240 is removed by grinding or some other method to expose the first bumps 216a.

Figure 3D:
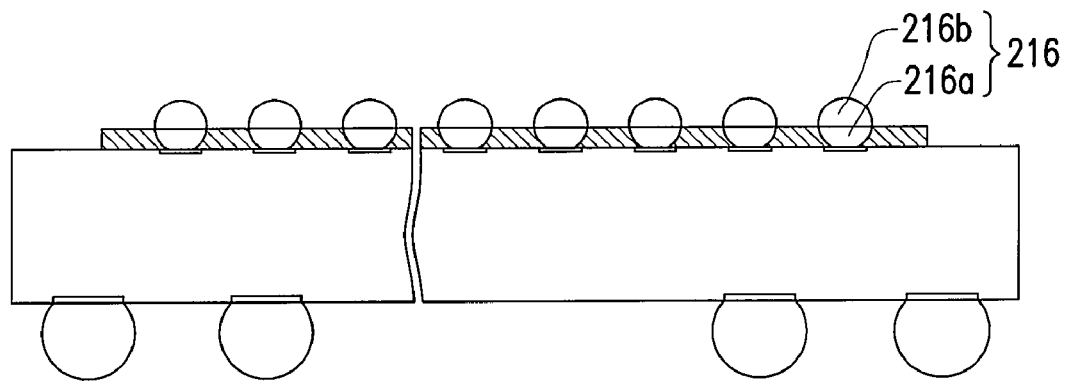

As shown in FIG. 3D, the second bumps 216b are formed over the first bumps 216a such that each of the second bumps 216b is formed on one of the first bumps 216a respectively.

Figure 3E:
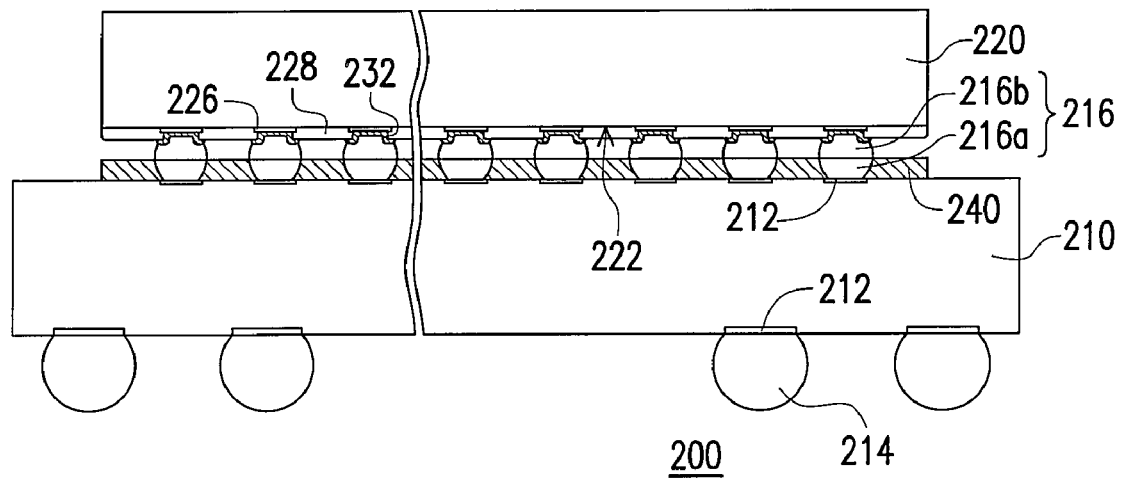

As shown in FIG. 3E, the chip 220 is flip-chip bonded and electrically connected to the carrier 210 through the first bumps 216a and the second bumps 216b. In fact, the chip package structure 200 in the second embodiment and the chip package structure 100 in the first embodiment have identical principal characteristics.

Figure 4A:
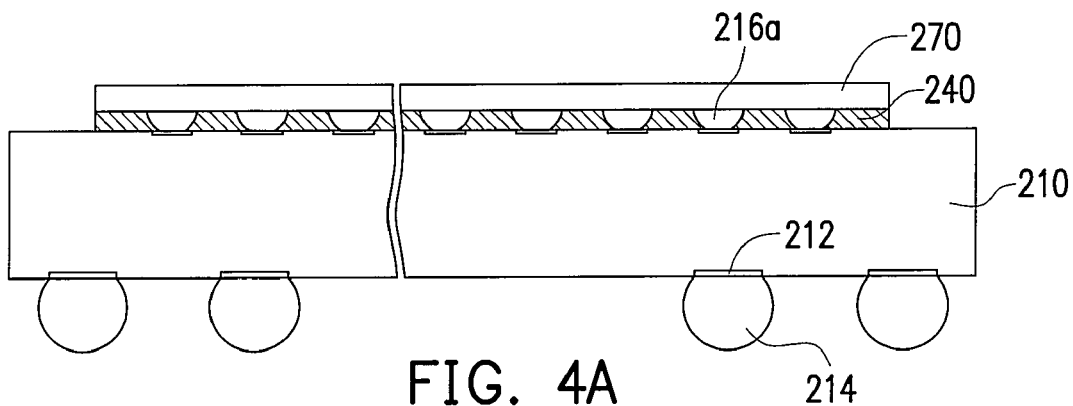
FIGS. 4A through 4D are schematic cross-sectional views showing the steps for fabricating second bumps according to the second embodiment of the present invention.
Figure 4B:
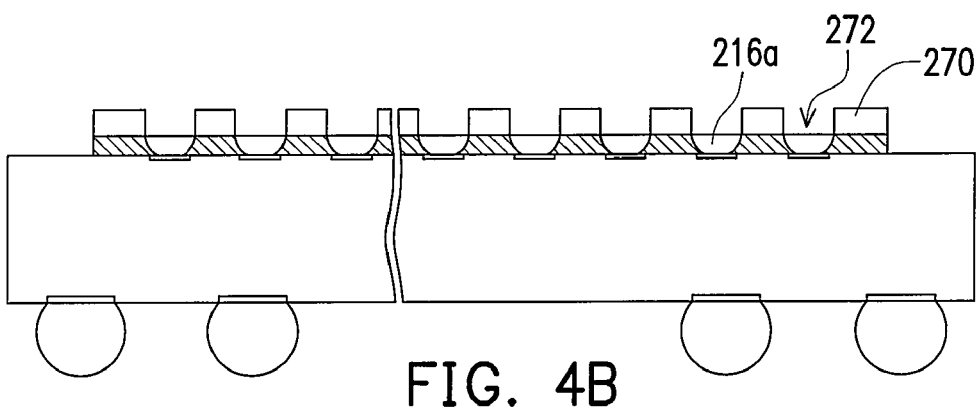
Figure 4C:
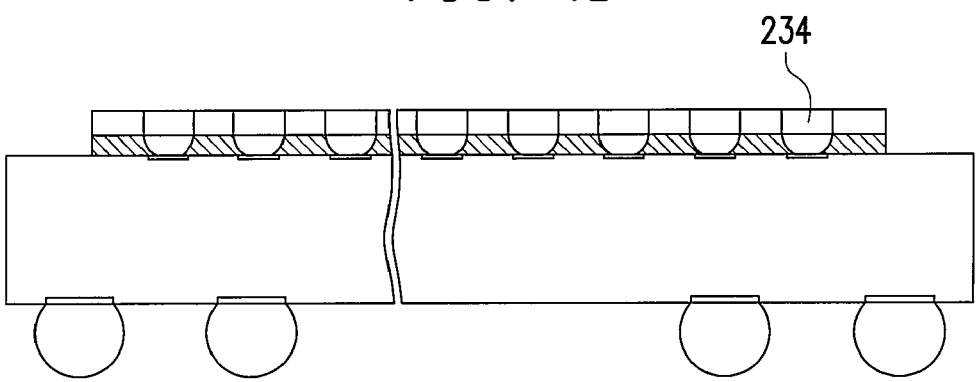
Figure 4D:
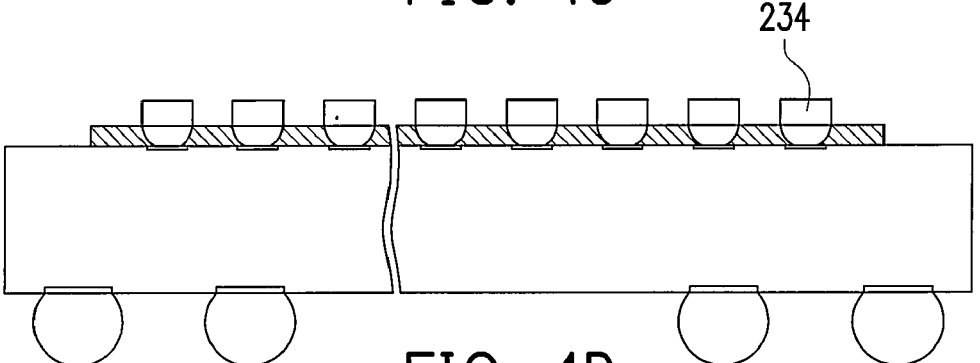

FIGS. 4A through 4D are schematic cross-sectional views showing the steps for fabricating second bumps according to the second embodiment of the present invention. The method of fabricating the second bumps in FIGS. 4A through 4D is used as an illustration only and should by no means limit the scope of the present invention. As shown in FIG. 4A, a photoresist layer 270 is formed over the carrier 210. The photoresist layer 270 covers the underfill layer 240 and the first bumps 216a. Thereafter, as shown in FIG. 4B, a plurality of openings 272 are formed in the photoresist layer 270 to expose the first bumps 216a. After that, as shown in FIG. 4C, a solder material is deposited into the openings 272 to form a plurality of solder blocks 234. As shown in FIG. 4D, the photoresist layer 270 is removed and then a reflow process is carried out to melt and transform the solder material 234 into second bumps 216b over the first bumps 216a as shown in FIG. 3D. The photoresist layer 270 can be a dry film or a liquid photoresist and the method of depositing solder material into the openings can be a stencil printing process, for example.

It should be noted that solder balls 214 could be attached to the surface of the carrier 210 away from the chip 220 after the chip 220 is flip-chip bonded to the carrier 110.

In summary, the underfill layer of the chip package structure according to the present invention is disposed on the carrier between the chip and the carrier. The underfill layer is detached from the chip so that a gap exists between the underfill layer and the chip. Since the chip is detached from the underfill layer, the underfill layer no longer produces any damaging effect on the chip as a result of thermal expansion. Furthermore, the underfill layer is formed in the bump process rather than relying on the capillary effect to draw the underfill material into the space between the chip and the carrier. Hence, the productivity of chip packages is significantly improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a carrier;
   a plurality of first sub-bumps on the carrier, wherein the first sub-bumps are arranged in an array;
   a plurality of second sub-bumps stacked on the first sub-bumps respectively;
   a chip having an active surface, wherein the chip is flip-chip bonded and electrically connected to the carrier through the first sub-bumps and the second sub-bumps such that the active surface of the chip faces the carrier and a periphery of the chip is at the exterior of the array and neighboring to both ends of the array; and
   an underfill layer formed on the carrier between the chip and the carrier by dispensing an underfill material over the carrier and then curing the underfill material before each of the second sub-bumps is disposed on the corresponding first sub-bump by depositing a solder material over the first sub-bump, reflowing, melting and transforming the solder material, wherein a periphery of the underfill layer is at the exterior of the array and neighboring to the both ends of the array, and the periphery of the chip is aligned with the periphery of the underfill, and a gap is maintained between the underfill layer and the chip, and the underfill layer is directly in contact with each of the first sub-bumps and coheres to each of the first sub-bumps.

2. The chip package structure of claim 1, wherein the carrier comprises a package substrate.

3. The chip package structure of claim 2, wherein the carrier have a top surface and a bottom surface, wherein the top surface has a plurality of first contacts and the bottom surface has a plurality of second contacts.

4. The chip package structure of claim 3, wherein the package further comprises an array of solder balls disposed on the second contacts on the bottom surface of the carrier away from the chip.

5. The chip package structure of claim 1, wherein the active surface has a plurality of bonding pads and a passivation layer and an under-bump metallic layer is formed over each bonding pad.

6. The chip package structure of claim 5, wherein at least one of the first sub-bumps is directly in contact with the under-bump metallic layer.

7. A chip package structure, comprising:
   a carrier;
   an array of first sub-bumps on the carrier;
   an array of second sub-bumps stacked on the array of the first sub-bumps;
   a chip having an active surface, wherein the chip is flip-chip bonded and electrically connected to the carrier through the first sub-bumps and the second sub-bumps such that the active surface of the chip faces a surface of the carrier having the first sub-bumps thereon to provide an overlap region of the carrier and the chip; and
   an underfill layer formed on the carrier completely within the overlap region without directly in contact with the active surface by dispensing an underfill material over the carrier and then curing the underfill material before each of the second sub-bumps is disposed on the corresponding first sub-bump by depositing a solder material over the first sub-bump, reflowing, melting and transforming the solder material, wherein the underfill layer is directly in contact with each of the first sub-bumps and coheres to each of the first sub-bumps.

8. The chip package structure of claim 7, wherein the carrier comprises a package substrate.

9. The chip package structure of claim 7, wherein the carrier have a top surface and a bottom surface, wherein the top surface has a plurality of first contacts and the bottom surface has a plurality of second contacts.

10. The chip package structure of claim 9, wherein the package further comprises an array of solder balls disposed on the second contacts on the bottom surface of the carrier away from the chip.

11. The chip package structure of claim 7, wherein the active surface has a plurality of bonding pads and a passivation layer and an under-bump metallic layer is formed over each bonding pad.

12. The chip package structure of claim 11, wherein at least one of the first sub-bumps is directly in contact with the under-bump metallic layer.

13. A chip package structure, comprising:
   a carrier;
   an array of first sub-bumps formed on the carrier;
   an array of second sub-bumps stacked on the array of the first sub-bumps;
   a chip having an active surface, wherein the chip is flip-chip bonded and electrically connected to the carrier through the second sub-bumps and the first sub-bumps sequentially such that the active surface of the chip faces a surface of the carrier having the first sub-bumps thereon to provide an overlap region of the carrier and the chip; and an underfill layer dispensed on the carrier completely within the overlap region, wherein a surface of the underfill layer and an interface between the first sub-bump and the second sub-bump are substantially coplanar and the underfill layer is directly in contact with the first sub-bump and coheres to the first sub-bump.

14. The chip package structure of claim 13, wherein the carrier comprises a package substrate.

15. The chip package structure of claim 13, wherein the active surface has a plurality of bonding pads and a passivation layer and an under-bump metallic layer is formed over each bonding pad.

16. The chip package structure of claim 13, wherein at least one of the second sub-bumps is directly in contact with the under-bump metallic layer.

17. The chip package structure of claim 13, wherein the carrier have a top surface and a bottom surface, wherein the top surface has a plurality of first contacts and the bottom surface has a plurality of second contacts.

18. The chip package structure of claim 17, wherein the package further comprises an array of solder balls disposed on the second contacts on the second surface of the carrier away from the chip.

19. The chip package structure of claim 17, wherein the first sub-bumps are disposed on the first contacts on the first surface of the carrier.

* * * * *